United States Patent
Brownfield

(10) Patent No.: US 6,683,387 B1
(45) Date of Patent: Jan. 27, 2004

(54) FLIP CHIP CARRIER PACKAGE WITH ADAPTED LANDING PADS

(75) Inventor: Terri J. Brownfield, Boulder Creek, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 188 days.

(21) Appl. No.: 09/593,816

(22) Filed: Jun. 15, 2000

(51) Int. Cl.[7] .............................................. H01L 23/48
(52) U.S. Cl. .................... 257/786; 257/778; 257/779; 257/784
(58) Field of Search ................. 257/778–783, 257/786

(56) References Cited

U.S. PATENT DOCUMENTS

| | | | |
|---|---|---|---|
| 5,853,517 A | | 12/1998 | Petefish et al. |
| 5,940,679 A | * | 8/1999 | Tomura et al. ................ 438/15 |
| 6,228,676 B1 | * | 5/2001 | Glenn et al. ................. 438/107 |
| 6,291,775 B1 | * | 9/2001 | Saitoh ......................... 174/250 |

FOREIGN PATENT DOCUMENTS

JP            7-231050    *  8/1995   ........... H01L/23/72

\* cited by examiner

*Primary Examiner*—Ori Nadav

(57) ABSTRACT

A carrier member is provided that has a plurality of landing pads thereon where at least one of the landing pads has a depression therein to hold at least one solder terminal of a device to be mounted thereto. Embodiments include a ceramic or a bismaleimide-triazine epoxy laminate carrier having an array of landing pads formed by depositing a eutectic solder, where each landing pad in the comer of the array has a depression therein.

13 Claims, 3 Drawing Sheets

FLIP CHIP CARRIER PACKAGE WITH ADAPTED LANDING PADS

BACKGROUND OF THE INVENTION

1. Field of the Invention

The present invention relates to a member for seating a semiconductor device, and more particularly to a ceramic or an organic carrier member having adapted landing pads thereon for mounting a bumped semiconductor device.

2. Background Art

In a conventional flip chip assembly or package, an integrated circuit (IC) die or chip, as well as other semiconductor devices, are "bumped" with solder, i.e. a plurality of discrete solder bumps are formed over metal contacts on the surface of the die. The chip is then turned upside down or "flipped" so that the device side or face of the IC die can be coupled to the carrier member, such as a ceramic or plastic carrier member having balls, pins or land grid arrays. The solder bumps of the device are attached to the carrier member to form an electrical and mechanical interconnection between the device and the carrier member. Directly coupling an IC die or chip to the carrier member by the use of an array of solder bumps accommodates an increased number of input/output (I/O) terminals and provides electrical signals immediately below the chip, improving voltage noise margins and signal speed.

As illustrated in FIG. 1, a conventional flip chip assembly 8 includes a device or IC die 10 mechanically and electrically attached to substrate 16 by a plurality of solder bumps 12 connected to solder pads 14 on substrate 16. Solder pads 14 are electrically connected to pin leads 18 by internal wiring (not shown for illustrative convenience) throughout substrate 16. Pin leads 18 are used to provide electrical connections to external circuitry. The assembly, thus, provides an electrical signal path from IC die 10 through solder/pad connections 12/14 through substrate 16, by way of internal wiring, to an external circuitry by way of pin leads 18.

As shown, substrate 16 has a plurality of solder pads 14, which are generally formed by screen printing a coating of solder on the substrate. Solder bumps 12 on die 10 are generally formed by known solder bumping techniques and are conventionally formed of a high lead (Pb) solder, such as solders having from 97–95 wt % Pb and from 3–5 wt % of tin (Sn). Substrate 16 can be made of ceramic or plastic materials. When the substrate is made of a ceramic, the electrical and mechanical interconnect between the die and substrate is conventionally achieved by reflowing the solder pads 14 and solder bumps 12 at a relatively high temperature, such as 350° C. to 370° C., to join solder bumps 12 and pads 14 between the die and substrate 16. It is preferable to have the high melting interconnection on the die to avoid degradation of the die/substrate interconnection in subsequent thermal processing steps.

Attaching a bumped die to a substrate involves aligning the bumped die to an array of solder pads on the substrate and then contacting the bumps on the device to the solder pads on the substrate. Once the device is in contact with the solder pads, the solder is reflowed to form an electromechanical interconnection thereby securing the device to the substrate. Reflowing the solders is typically carried out by moving the aligned assembly into a heated furnace.

One problem associated with this process, however, is proper alignment of the device to the array of solder pads on the substrate. Further, once the aligned device is placed on the substrate, there is a tendency for the die to move off of the solder pads, particularly when the assembly is placed into a furnace or during reflow of the solder pads to the form the electro-mechanical interconnection in the furnace. As the density of interconnects increases and the need for lighter and smaller packages increase, the problems associated with attaching IC dies and capacitors to substrates are exacerbated.

Accordingly, a continuing need exists in the art for improved methods of attaching dies with a higher density of interconnects while forming reliable electro-mechanical interconnections between the die and the carrier member.

SUMMARY OF THE INVENTION

An advantage of the present invention is a carrier member suitable for seating a device thereto.

Additional advantages and features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a carrier member for seating a device having a plurality of solder terminals, such as a bumped IC die, capacitor, etc. The carrier member comprises: a substrate having a plurality of landing pads thereon and a plurality of leads on the substrate that are in electrical communication with the landing pads. In accordance with the present invention, at least one of the plurality of landing pads is adapted to receive the device to be mounted thereto. Advantageously, at least one of the landing pads has a depression or cavity therein such that at least one of the solder terminals on the device rests in the depression thereby seating the device and preventing the device from moving off of the plurality of landing pads on the substrate.

Embodiments of the present invention include a substrate having a plurality of landing pads arranged in a grid array wherein at least two landing pads of the periphery of the grid array have depressions or cavities therein and wherein the landing pads comprise eutectic solder, i.e., solder containing about 63 wt % tin and about 37 wt % lead. In an embodiment of the present invention, the substrate is a ceramic material or an organic substrate comprising an organic resin, with optionally fiberous materials, such as glass fibers, throughout the resin. The organic substrate can be a laminated structure with alternating insulative and conductive layers. Alternatively, the organic substrate can be fabricated as a non-laminated structure, such as a molded plastic part with internal wiring.

Another aspect of the present invention is a method of manufacturing a carrier member having at least one adapted landing pad. The method comprises providing a carrier member for seating a device, wherein the carrier member comprises a substrate having a plurality of landing pads thereon and a plurality of leads on the substrate which are in electrical communication with the landing pads; and forming a depression or cavity in at least one of the plurality of landing pads so that a terminal of a device can be received in the depression when the device is mounted on the carrier member to seat the device.

Embodiments of the present invention include forming the plurality of landing pads with eutectic solder and forming the depression by coining or stamping at least one landing pad to form the depression or cavity.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments and its several details are capable of modifications in various obvious respects, all without departing from the present invention. Accordingly, the drawing and description are to be regarded as illustrative in nature, and not as restrictive.

DESCRIPTION OF THE INVENTION

The present invention stems from the discovery that employing landing pads having an indentation, depression or cavity therein on a carrier member improves the stability of a device/carrier member assembly prior to forming an electro-mechanical interconnection between the device and member, particularly a device having a plurality of solder terminals, i.e., a bumped die, integrated circuit, etc. In particular, it was discovered that by disfiguring several landing pads of a grid array on a substrate to a shape that readily accepts the terminals of a device prevents the device placed on the substrate from moving during the interconnect process.

Figure 1:
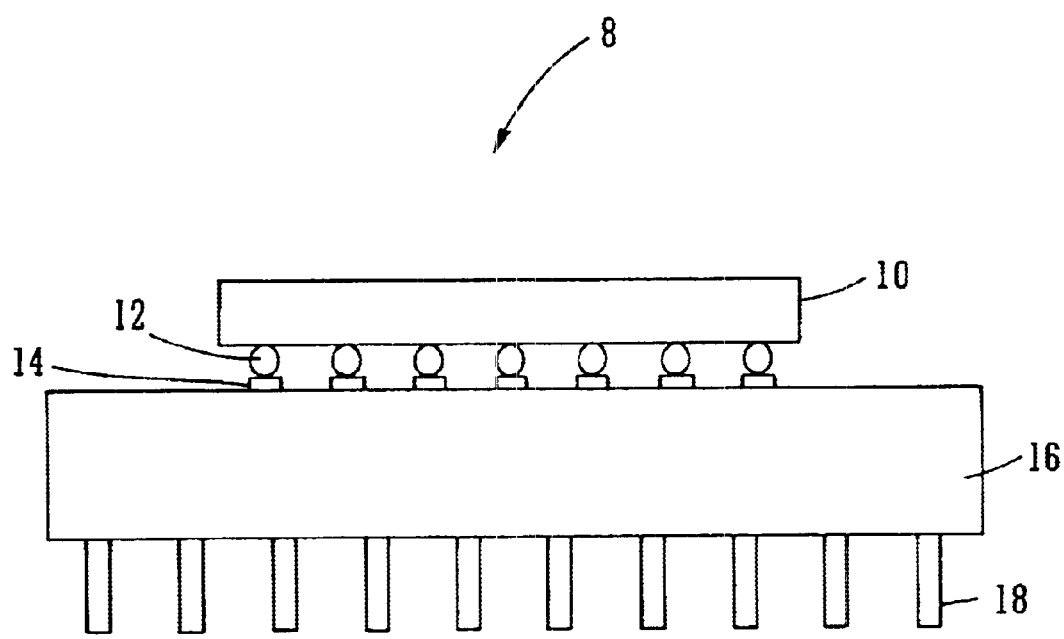
FIG. 1 schematically depicts a conventional flip chip assembly.
Figure 2:
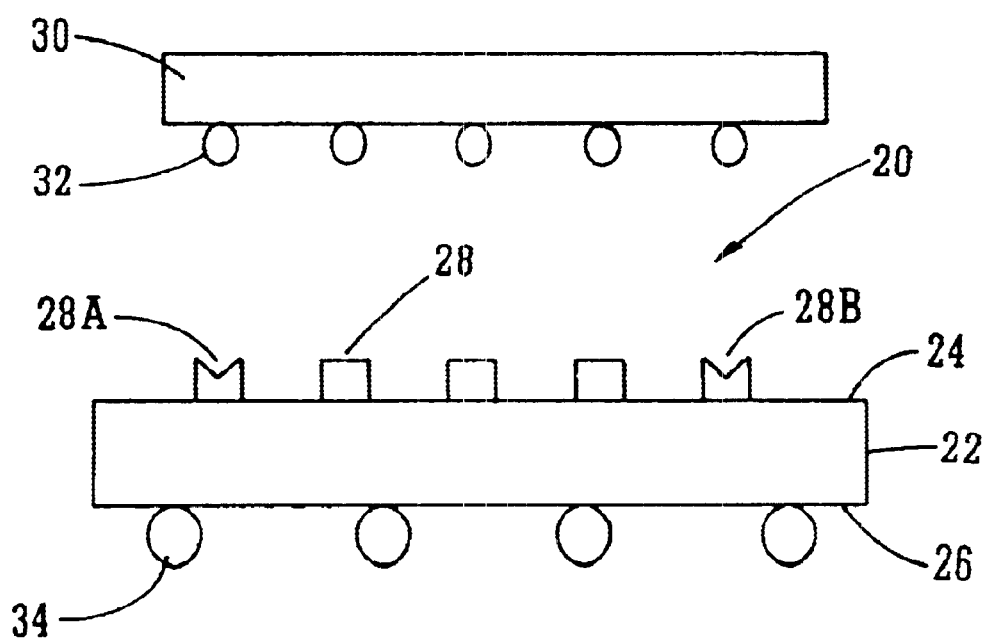
FIG. 2 schematically illustrates a cross-sectional view of carrier member of the present invention.

FIG. 2 illustrates an embodiment of a carrier member of the present invention. As illustrated, carrier member 20 comprises substrate 22 having a top surface 24 and a bottom surface 26. An array of landing pads 28 are formed on the top surface 24 of substrate 22 for receiving a device 30 having a corresponding array of solder bumps 32

An array of leads in the form of solder bumps 34 on the bottom surface 26 of substrate 22 are in electrical communication with landing pads 28 by an internal conductive structure, i.e. internal wiring (not shown for illustrative convenience). Leads 34 are used to electrically connect the assembled package to external circuitry, such as a printed circuit board. The leads for externally connecting the substrate can also be in the form of metallized contacts or pins, for example. The array of landing pads 28 is patterned to correspond to solder bumps 32 of device 30 to be mounted on top surface 24 of substrate 22.

In the embodiment shown in FIG. 2, two peripheral landing pads 28A–B have depressions therein. The depressions in the landing pads are formed so that the substrate holds the device when mounted on the substrate, that is, once the solder bumps 32 are positioned and placed on landing pads 28, 28A and 28B, device 30 is reluctant to move off of the landing pad array.

In accordance with the present invention, a substrate is provided having a plurality of landing pads on the top surface thereof for seating a device. In an embodiment of the present invention, substrate 22 has an array of landing pads 28 made of an electrically conductive, solder-wettable material, such as one or more layers of copper, nickel, gold, etc. at a total thickness of about 4–8 microns. Several thousand of such landing pads can be fashioned on an organic or ceramic carrier substrate. The landing pads can be on the same surface as leads 34 or on a different surface on the substrate.

Figure 3:
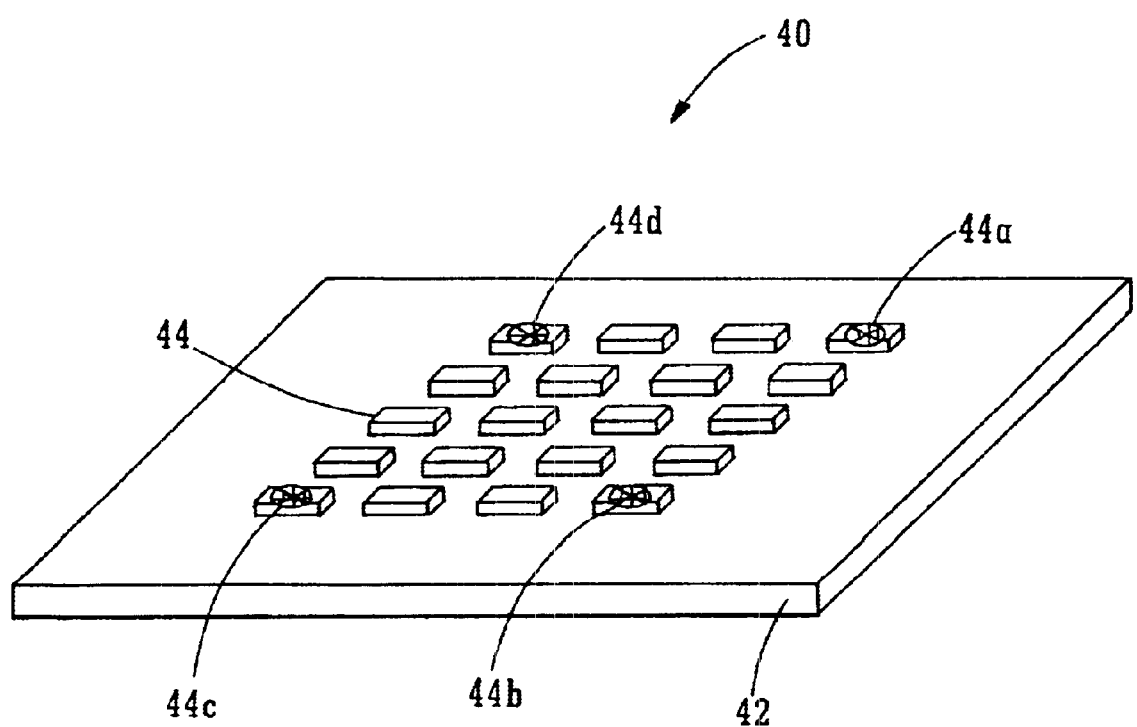
FIG. 3 depicts a cross-sectional view of a device assembly comprising a carrier member of the present invention.

FIG. 3 illustrates another embodiment of a carrier member of the present invention. As illustrated, carrier member 40 comprises a ceramic substrate 42 having an array of landing pads 44 formed on substrate 42. In the present embodiment, the plurality of landing pads are arranged in a grid array having an inner set of landing pads and landing pads on the periphery of the inner set. Landing pads 44A–D have been adapted to seat a terminal on a device in accordance with the present invention.

In practicing the invention, solder alloys can be used to form the discrete landing pads on the substrate by conventional solder pad forming techniques such as screen printing, dispensing, or electroplating solder on the surface of the substrate. The solder pads of the present invention can be initially shaped as a hemisphere, dome, cylindrical column, pedestal, stud, post, flat rectangular, hourglass, or pyramid structures. The array of solder pads on the substrate is arranged to correspond to the particular semiconductor device to be mounted thereon.

Given the guidance and objectives of the present disclosure, the optimum solder compositions and substrate can be necessarily determined for a particular carrier member. In an embodiment of the present invention, the plurality of landing pads formed on the substrate comprises a eutectic solder alloy, i.e., a solder alloy containing about 63 wt % tin and about 37 wt % lead formed by conventional solder forming techniques.

In practicing the invention, solder balls are formed on the substrate in an array that corresponds to the device to be mounted thereto. In accordance with the present invention, one or more of the landing pads are disfigured so that it can seat or receive a solder bump of a device. In an embodiment of the present invention, a depression can be formed in at least one of the landing pads by placing a slug having a dimple or projection on the contacting surface thereof on one or more of the solder balls and applying sufficient pressure for a sufficient period of time to the slug to form a flattened landing pad with a depression or cavity therein. It is contemplated that the coining or stamping process can be carried out on certain landing pads or on all of the landing pads of the array.

In an embodiment of the present invention, the landing pads are initially formed as solder ball comprising eutectic solder on an organic or ceramic substrate, e.g. an alumna circuitized substrate, and all of the landing pads are then stamped with a slug to form depressions therein. An organic substrate of the present invention can be fabricated in the form of a molded part or as a laminated structure. A laminated structure having a plurality of dielectric layers and alternating conductive layers, for example, can be fabricated by layering an organic polymer layer having optionally fiberous materials therethrough, such as glass fibers, with metal layers, where the metal layers electrically connect the landing pads to leads on the substrate. Organic resins such as polyphenylene sulphide, polysulphone, polyethersulphone, polyarysulphone, phenol, polyamide, bismaleimide-triazine, epoxy or mixtures thereof can be used to fabricate the dielectric layers. In an embodiment of the present invention, the organic substrate is fabricated from an organic epoxy-glass resin based material, such as bismaleimide-triazine (BT) resin or FR-4 board laminate having a high thermal decomposition temperature.

In practicing the invention, a device assembly can be prepared by aligning a device having a plurality of solder terminals thereon with the landing pads on the top surface of the substrate of the present invention. The device can be any device having a solder terminal thereon, as for example, a solder bumped IC with 97–95 wt % lead/3–5 wt % tin, or a bumped capacitor, or any other device having a solder terminal.

Once the device is aligned with the carrier member of the present invention, the device is placed on the landing pads of the carrier member such that a terminal of the device is seated in at least one of the landing pads having a depression or cavity therein. An electrical interconnection is then formed between the device and the carrier member by the application of infrared radiation, a flow of dry heated gas, such as in a belt furnace, or a combination thereof, to reflow solder terminals of the device and/or reflow the landing pads on the substrate to interconnect the device and carrier member.

In an embodiment of the present invention, a device assembly is prepared by providing a substrate comprising a bismaleimide-triazine epoxy laminate having an array of landing pads on the top surface thereof and an array of leads extending from the bottom surface and in electrical communication with the landing pads on the top surface. The landing pads comprise eutectic solder and a plurality of the landing pads have been stamped to have a cavity therein such that solder bumps of a device to be mounted thereto can be seated in the cavity of the landing pads. The semiconductor device is then aligned with the array of landing pads on the top surface of the substrate and placed on the landing pad array. Interconnection between the device and substrate is then carried out by a process of heating the carrier member at about 220° C. to about 270° C., e.g. heating the carrier member to about 250° C.–265° C., by a process of a combined infrared/convection heater.

The process steps and structures described above do not form a complete process flow for manufacturing device assemblies or the packaging of integrated semiconductor devices. The present invention can be practiced in conjunction with electronic package fabrication techniques currently used in the art, and only so much of the commonly practiced process steps are included as are necessary for an understanding of the present invention. The figures representing cross-sections of portions of electronic package fabrication are not drawn to scale, but instead are drawn to illustrate the features of the present invention.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A carrier member for seating a device having a plurality of solder terminal, the carrier member comprising:

a substrate having a plurality of landing pads thereon; and a plurality of leads on the substrate which are in electrical communication with the landing pads on the substrate; wherein at least one of the plurality of landing pads has a depression therein adapted for seating at least one of the solder terminals on the device.

2. The carrier member of claim 1, wherein the plurality of landing pads are arranged in grid array having landing pads on the periphery of the array.

3. The carrier member of claim 2, wherein at least two landing pads on the periphery of the grid array have depressions.

4. The carrier member of claim 2, wherein the grid array is arranged as a square and wherein each landing pad in the corner of the array has a depression therein.

5. The carrier member of claim 1, wherein the plurality of landing pads comprise eutectic solder.

6. The carrier member of claim 1, wherein the substrate is a ceramic substrate.

7. The carrier member of claim 1, wherein the substrate comprises a bismaleimide-triazine epoxy laminate.

8. A carrier member for seating a device having a plurality of solder terminal, the carrier member comprising:

a substrate comprising a bismaleimide-triazine epoxy laminate having a plurality of landing pads thereon; and a plurality of leads on the substrate which are in electrical communication with the landing pads on the substrate, wherein the plurality of landing pads comprise solder and wherein at least one of the plurality of landing pads has a depression therein adapted for seating at least one of the solder terminals on the device.

9. A method of manufacturing a carrier member having at least one adapted landing pad, the method comprising:

providing a carrier member for mounting a device, wherein the carrier member comprises a substrate having a plurality of solder balls thereon; and forming a depression or cavity in at least one of the plurality of landing pads so that a terminal of a device can be seated in the depression or cavity when the device is mounted on the carrier member.

10. The method of claim 9, comprising forming the depression by placing a slug having a dimple or projection on the contacting surface thereof on one or more of the solder balls and applying sufficient pressure for a sufficient period of time to the slug to form a flattened landing pad with a depression or cavity therein.

11. The method of claim 9, comprising forming the depression by contacting the at least one landing pad with a laser beam.

12. The method of claim 11, wherein the plurality of landing pads comprise eutectic solder.

13. The method of claim 9, wherein the substrate comprises a ceramic material.

* * * * *